(12) United States Patent
Chen

(10) Patent No.: US 11,522,070 B2
(45) Date of Patent: Dec. 6, 2022

(54) MANUFACTURING METHOD OF LOW TEMPERATURE POLY-SILICON SUBSTRATE (LTPS)

(71) Applicant: WUHAN CHINA STAR OPTOELECTRONICS TECHNOLOGY CO., LTD, Wuhan (CN)

(72) Inventor: Chen Chen, Wuhan (CN)

( * ) Notice: Subject to any disclaimer, the term of this patent is extended or adjusted under 35 U.S.C. 154(b) by 191 days.

(21) Appl. No.: 16/968,885

(22) PCT Filed: Oct. 8, 2018

(86) PCT No.: PCT/CN2018/109315
§ 371 (c)(1),
(2) Date: Aug. 11, 2020

(87) PCT Pub. No.: WO2020/042278
PCT Pub. Date: Mar. 5, 2020

(65) Prior Publication Data
US 2021/0050432 A1 Feb. 18, 2021

(30) Foreign Application Priority Data
Aug. 29, 2018 (CN) .......................... 201810994623.3

(51) Int. Cl.
*H01L 29/66* (2006.01)
*H01L 21/285* (2006.01)
(Continued)

(52) U.S. Cl.
CPC .... *H01L 29/66757* (2013.01); *H01L 21/2855* (2013.01); *H01L 21/31116* (2013.01); *H01L 21/32139* (2013.01)

(58) Field of Classification Search
CPC .......... H01L 29/66757; H01L 21/2855; H01L 21/31116; H01L 21/32139
See application file for complete search history.

(56) References Cited

U.S. PATENT DOCUMENTS 5,660,971 A * 8/1997 Kobayashi ........ H01L 29/66757
257/E29.147
6,387,784 B1 * 5/2002 Chong ................ H01L 29/6656
438/585
(Continued)

FOREIGN PATENT DOCUMENTS

CN 105552084 A 5/2016
CN 106169441 A 11/2016
(Continued)

*Primary Examiner* — Nicholas J Tobergte
*Assistant Examiner* — Tenley H Schofield

(57) ABSTRACT

A manufacturing method of a low temperature poly-silicon (LTPS) array substrate is described. The LTPS array substrate includes a metal light-shielding layer, a buffer layer, a polycrystalline silicon layer, a gate insulating and interlayer insulating layer, a gate line layer, and a source and drain electrode layer. The method adopts a one-time chemical vapor deposition process to form a gate insulator and interlayer insulating layer. A gate line trench is formed in the gate insulating layer and the interlayer insulating layer, thereby reducing the thickness of the LTPS array substrate film layer and the process steps.

7 Claims, 7 Drawing Sheets

(51) Int. Cl.
   *H01L 21/311*   (2006.01)
   *H01L 21/3213*   (2006.01)

(56) References Cited

U.S. PATENT DOCUMENTS

| | | | | |
|---|---|---|---|---|
| 9,343,548 | B1* | 5/2016 | Sang | H01L 29/41733 |
| 2002/0093017 | A1* | 7/2002 | Andry | H01L 21/02672 |
| | | | | 257/350 |
| 2004/0004220 | A1* | 1/2004 | Suzuki | H01L 29/66757 |
| | | | | 257/E21.414 |
| 2007/0032036 | A1* | 2/2007 | Wang | H01L 29/78636 |
| | | | | 257/E21.414 |
| 2008/0057649 | A1* | 3/2008 | Schuele | H01L 29/78627 |
| | | | | 257/E21.429 |
| 2012/0168721 | A1* | 7/2012 | Kelber | H01L 21/02381 |
| | | | | 977/734 |
| 2015/0279859 | A1* | 10/2015 | Chen | H01L 27/124 |
| | | | | 438/151 |
| 2016/0133738 | A1 | 5/2016 | Chang et al. | |
| 2018/0033883 | A1* | 2/2018 | Zhou | H01L 27/1255 |
| 2018/0033979 | A1* | 2/2018 | Jang | B32B 9/041 |
| 2018/0122835 | A1 | 5/2018 | Watakabe | |
| 2019/0011772 | A1* | 1/2019 | Yao | H01L 29/78633 |
| 2019/0067340 | A1 | 2/2019 | Shu et al. | |
| 2019/0074305 | A1* | 3/2019 | Gong | H01L 29/41733 |
| 2019/0140102 | A1* | 5/2019 | Matsushima | H01L 29/78618 |
| 2020/0212227 | A1* | 7/2020 | Li | H01L 29/78666 |

FOREIGN PATENT DOCUMENTS

| | | |
|---|---|---|
| CN | 106252277 A | 12/2016 |
| CN | 106952963 A | 7/2017 |
| CN | 108666218 A | 10/2018 |

\* cited by examiner

MANUFACTURING METHOD OF LOW TEMPERATURE POLY-SILICON SUBSTRATE (LTPS)

BACKGROUND

Field

The present disclosure relates to a technical field of liquid crystal displays, and more particularly to a manufacturing method of low temperature poly-silicon array substrates (LTPS).

Background

In a manufacturing procedure of display screens, because product cost made of low temperature poly-silicon (LTPS) is low and the electron mobility of the device is high, display manufacturers of mobile phones and tablet screens are in favor of these products.

In a conventional LTPS manufacturing process, the LTPS array substrate uses two times of chemical vapor deposition process on the polycrystalline silicon layer in the process for forming a gate insulator (GI) and an interlayer dielectric (ILD), where the gate insulating layer and the interlayer insulating film are regarded as two layer structures individually.

FIG. 1 is a schematic cross-sectional structure of a low temperature poly-silicon (LTPS) array substrate in the prior art. In the structure of the LTPS array substrate, a light shielding layer 102, a buffer layer 103, and a polycrystalline silicon layer 104 are sequentially stacked on the glass substrate 101, and then performing chemical vapor deposition (CVD) twice on the polysilicon layer 104 to form a first gate insulating layer 105 and a second gate insulating layer 106, a gate line layer 112, a first interlayer insulating film 107, and a second interlayer insulating film 108. Finally, through holes 110 of a source electrode 111 and a drain electrode 109 are formed by an exposure and etching process. The source electrode 111 and the drain electrode 109 are in contact with the polycrystalline silicon layer 104 by the through holes 110.

Therefore, the manufacturing method of LTPS array substrate requires more film layers, the manufacturing method is complex, the manufacturing time is long, and the production cost of the manufacturing method is high. Therefore, it is necessary to provide a manufacturing method of an LTPS array substrate to solve the problems.

SUMMARY OF THE DISCLOSURE

The present disclosure provides a manufacturing method of a low temperature poly-silicon (LTPS) array substrate, and is used to solve technical problems of a plurality of film layers and a complex manufacturing method in the LTPS array substrate manufacturing process.

The present disclosure provides a manufacturing method of a low temperature poly-silicon (LTPS) array substrate. The LTPS array substrate includes a metal light-shielding layer, a buffer layer, a polycrystalline silicon layer, a gate insulating and interlayer insulating layer, a gate line layer, and a source and drain electrode layer.

The manufacturing method includes following steps:

step S10, providing a transparent substrate, depositing a metal layer on the transparent substrate, and patterning the metal layer for forming the metal light-shielding layer;

step S20, forming the buffer layer on the metal light-shielding layer;

step S30, forming the polycrystalline silicon layer on the buffer layer;

step S40, forming the gate insulating and interlayer insulating layer through chemical vapor deposition on the polycrystalline silicon layer;

step S50, forming the gate line layer on the gate insulating and interlayer insulating layer; and step S60, forming the source and drain electrode layer on the gate insulating and interlayer insulating layer.

In an embodiment of the manufacturing method, the step S50 further includes:

in step S501, coating negative photoresist on the gate insulating and interlayer insulating layer for exposure, for forming a patterned photoresist layer;

in step S502, performing a dry etching process on the gate insulating and interlayer insulating layer after developing the patterned photoresist layer, for forming a gate line trench;

in step S503, forming the gate line layer through physical vapor deposition in the gate line trench; and in step S504, coating positive photoresist on the gate line layer, and performing an exposure and etching process for forming a gate line pattern.

In an embodiment of the manufacturing method, the gate insulating and interlayer insulating layer are defined as a two-layer structure.

In an embodiment of the manufacturing method, during the step S502, a dry etching process is performed above the gate insulating and interlayer insulating layer for forming the gate line trench.

In an embodiment of the manufacturing method, a cross section shape of the gate line trench is rectangular.

In an embodiment of the manufacturing method, the step S60 further includes following steps:

in step S601, exposing, developing, and etching a upper portion of the gate insulating and interlayer insulating layer corresponding to the polycrystalline silicon layer, for forming through holes and a follow-up pattern;

in step S602, forming a source electrode and a drain electrode in the through holes, the source electrode and the drain electrode are correspondingly in contact with the polycrystalline silicon layer via the through holes, and forming the source and drain electrode layer.

In an embodiment of the manufacturing method, a cross section area of the through holes is in an inverted trapezoid shape.

In an embodiment of the manufacturing method, a material of the gate line layer is selected from a group consisting of molybdenum, titanium, aluminum, copper, and combinations of the molybdenum, the titanium, the aluminum, and the copper.

In an embodiment of the manufacturing method, a material of the buffer layer includes silicon nitride, silicon oxide, or a combination of the silicon nitride and the silicon oxide, and a material of the gate insulating and interlayer insulating layer used in a manufacturing process of the LTPS array substrate includes silicon nitride, silicon oxide, or a combination of the silicon oxide and the silicon oxide.

In an embodiment of the manufacturing method, a material of the metal light-shielding layer includes molybdenum aluminum alloy, chromium, molybdenum, or materials with the light shielding function and electric conductivity simultaneously.

The advantages of the present disclosure includes: when a structure of semiconductor device is not changed, the manufacturing method is optimized. The gate insulating and interlayer insulating layer is formed by one-time chemical vapor deposition process to replace two times of chemical vapor deposition process in the prior art, thereby decreasing a thickness of the LTPS array substrate, reducing manufacturing steps, saving process time, and thus reducing the production cost.

BRIEF DESCRIPTION OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF THE PREFERRED EMBODIMENTS

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

The present disclosure is further described in the following with reference to the accompanying drawings and specific embodiments.

Embodiment 1

The present disclosure provides a manufacturing method of an LTPS array substrate, the manufacturing method is described in detail in conjunction with FIG. 2 to FIG. 6.

As shown in the figures, the manufacturing method includes the following steps.

Figure 1:
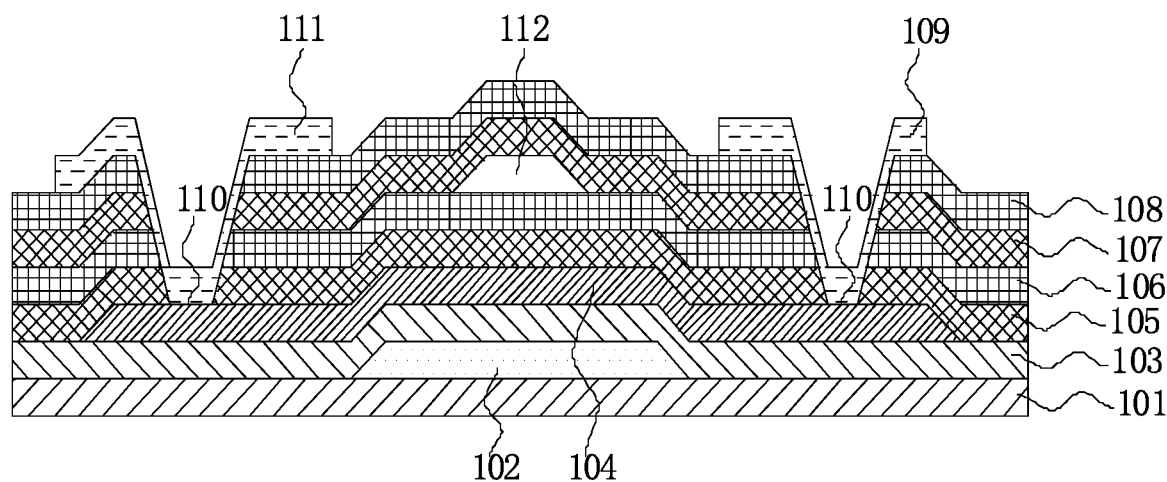
FIG. 1 is a schematic cross-sectional structure of a low temperature poly-silicon (LTPS) array substrate in the prior art.
Figure 2:
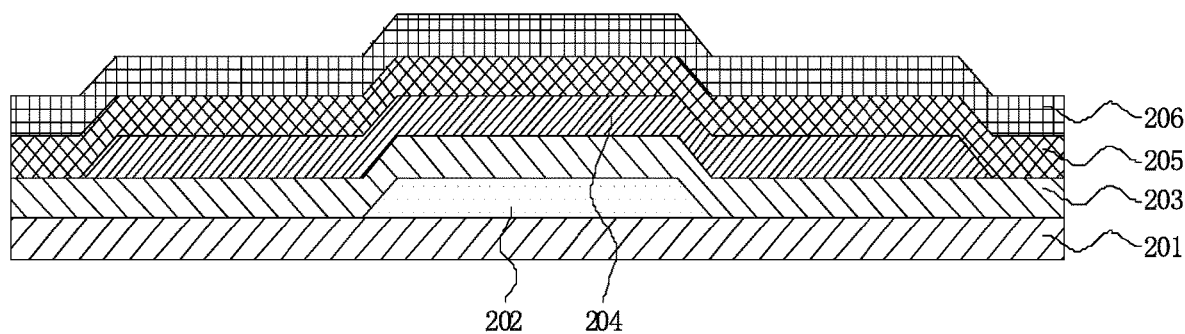
FIG. 2 is a schematic cross-sectional structure of a gate insulator and an interlayer insulating film for chemical vapor deposition in a manufacturing method according to one embodiment of the present disclosure.

In step S10, as shown in FIG. 2, a substrate 201 is provided, the substrate 201 is made of a transparent substrate, e.g. a transparent glass substrate. A metal layer is deposited on the substrate 201, and the metal layer is patterned by a photo-etching process. A metal light-shielding layer 202 is formed on the substrate 201. A material of the metal light-shielding layer 202 includes molybdenum aluminum alloy, chromium, molybdenum, or materials with the light shielding function and electric conductivity simultaneously.

In step S20, the buffer layer 203 is formed on the metal light-shielding layer 202. A material of the buffer layer 203 includes silicon nitride, silicon oxide, or a combination of the silicon nitride and the silicon oxide.

In step S30, an amorphous silicon layer is deposited on the buffer layer 203, a high-temperature oven is adopted for conducting dehydrogenation process treatment on the amorphous silicon layer, so as to prevent the hydrogen explosion phenomenon in a crystallization process. After the dehydrogenation process is completed, a laser annealing process, a metal induction crystallization process, and a solid-phase crystallization process are adopted to perform crystallization treatment on the amorphous silicon layer. A polycrystalline silicon layer 204 is formed on the buffer layer 203.

In step S40, a chemical vapor deposition method is adopted on the buffer layer 203 and the polysilicon layer 204 to form a first gate insulation and interlayer insulating layer 205 and a second gate insulation and interlayer insulating layer 206. The gate insulating layer and the interlayer insulating layers are made of silicon nitride or silicon oxide or a combination of the silicon nitride or the silicon oxide.

Figure 3:
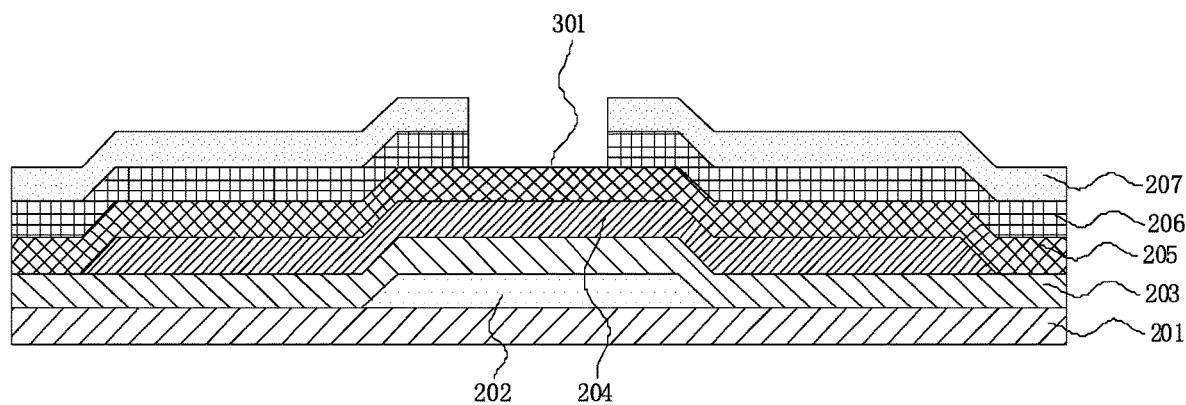
FIG. 3 is a schematic cross-sectional structure of a gate line trench in the manufacturing method according to one embodiment of the present disclosure.
Figure 4:
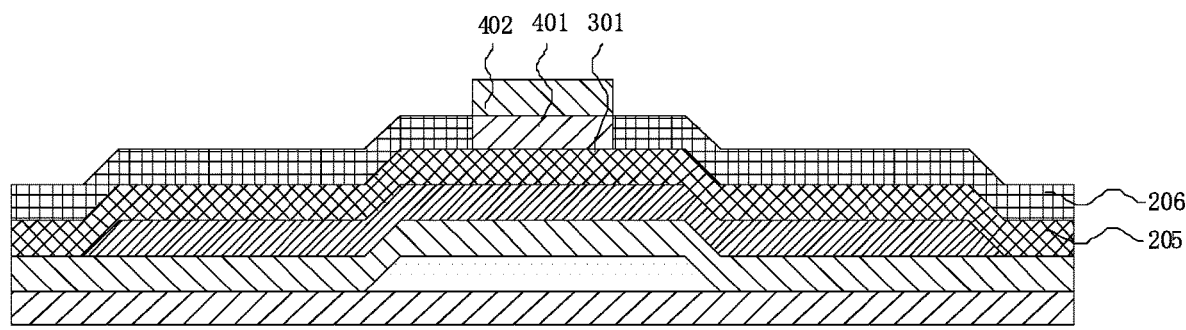
FIG. 4 is a schematic cross-sectional structure of a gate line layer in the manufacturing method according to one embodiment of the present disclosure.

In step S50, as shown in FIG. 3, a negative photoresist is coated on the second gate insulating and interlayer insulating layer 206 for exposure to form a patterned photoresist layer. A dry etching process is performed on the second gate insulating and interlayer insulating layer 206 after developing the patterned photoresist layer, for forming a gate line trench 301. The cross section shape of the gate line trench 301 is rectangular. The material of the negative photoresist is made of molybdenum-aluminum alloy, chromium, molybdenum, or other low-resistance conductive materials. As shown in FIG. 4, a gate line layer 401 is formed in the gate line trench 301 by a physical vapor deposition method. The gate line layer 401 is made of molybdenum, titanium, aluminum, copper, and combinations of the molybdenum, the titanium, the aluminum, and the copper. A positive photoresist 402 is coated on the gate line layer 401, an exposure and an etching processes are performed for forming a gate line pattern.

Figure 5:
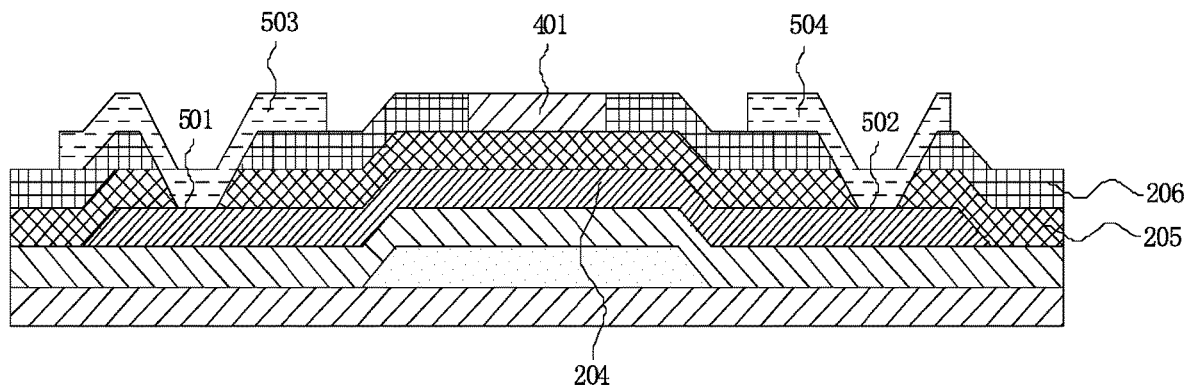
FIG. 5 is a schematic cross-sectional structure of an LTPS array substrate made by the manufacturing method according to one embodiment of the present disclosure.
Figure 6:
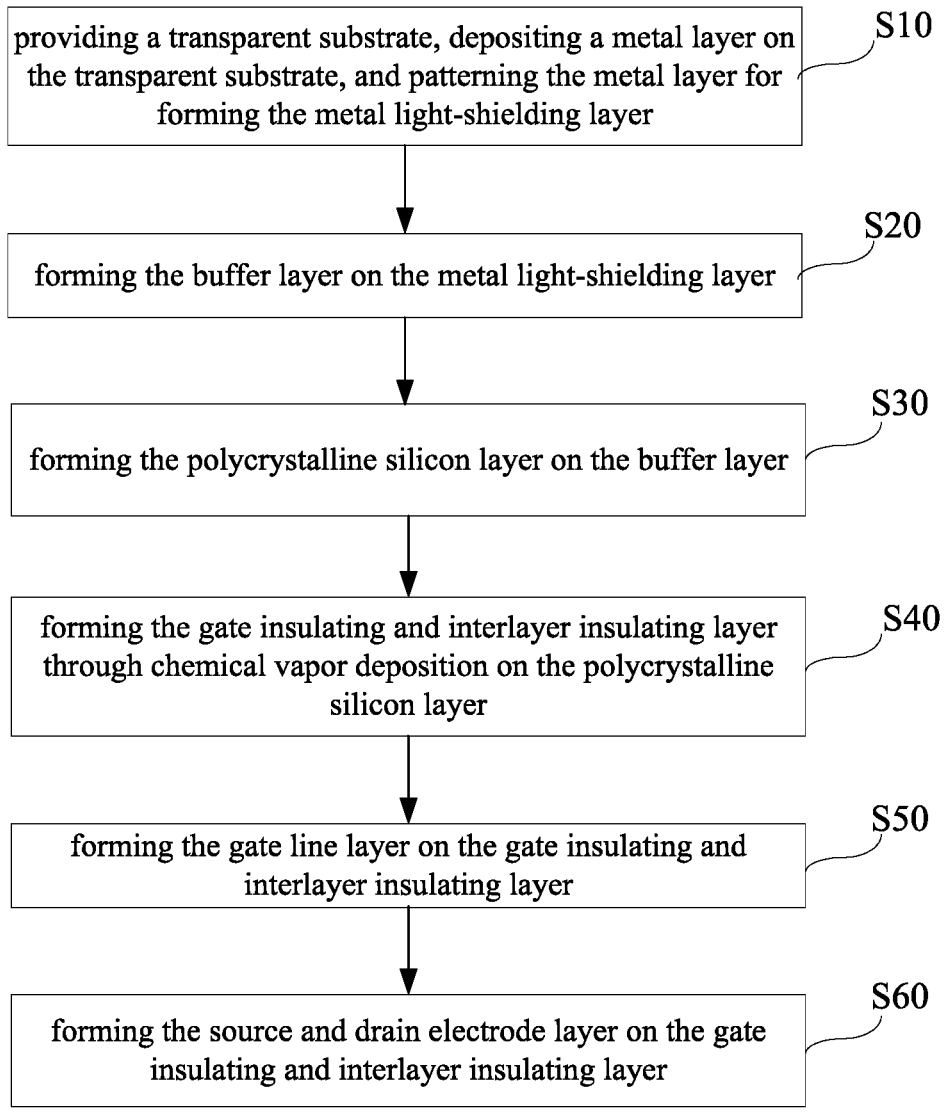
FIG. 6 is a flowchart of the manufacturing method of the LTPS array substrate according to one embodiment of the disclosure.

In step S60, as shown in FIG. 5, a first through hole 501 and a second through hole 502 are formed by a dry etching on the gate insulation and interlayer insulating layer. The first through hole 501 and a second through hole 502 is in form of a cross-sectional shape of the inverted trapezoid shape. An exposed portion of the first through hole 501 and the second through hole 502 is a patterned polycrystalline silicon layer 204. A source electrode 503 is formed in the first through hole 501, and a drain electrode 504 is formed in the second through hole 502. The source electrode 503 and the drain electrode 504 are correspondingly in contact with the polycrystalline silicon layer 204 via the first through hole 501 and the second through hole 502. The gate line layer 401, the source electrode 503, and the drain electrodes 504 are located on the same layer and the thickness of the array substrate is reduced.

Embodiment 2

In the first embodiment, a trench for a gate line is formed in the gate insulating and interlayer insulating layer. A gate line trench is formed by the trench and a gate line is formed in the gate line trench. The gate line, the source electrode, and the drain electrode are disposed on the same layer, such that a structure of the LTPS array substrate is simplified, and the thickness of the LTPS array substrate is reduced. In contrast, the process of forming gate line trenches by exposure and etching process, and physical vapor deposition are required according to the first embodiment of the present disclosure.

Figure 7:
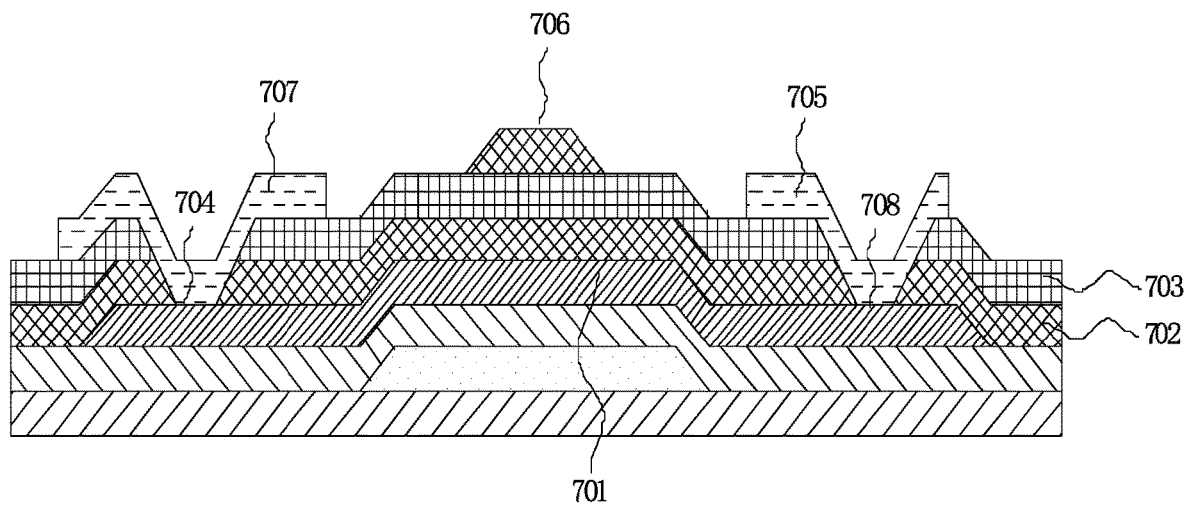
FIG. 7 is a schematic cross-sectional structure of an LTPS array substrate made by the manufacturing method according to another embodiment of the present disclosure.

As described in the embodiment of FIG. 7, the manufacturing steps of gate line trenches are omitted. After the steps S10 to S40 are performed as described in the first embodiment, a polycrystalline silicon layer 701, a first gate insulating and interlayer insulating layer 702, a second gate insulating and interlayer insulating layer 703 are formed. A positive photoresist is directly coated on the second gate insulating and interlayer insulating layer 703. A positive photoresist is coated on the second gate insulating and interlayer insulating layer 703, and an exposure and etching process is performed for forming a through holes and a follow-up pattern.

A first through hole 704 and a second through hole 708 are formed by an etching process on the gate insulation and interlayer insulating layer. The polycrystalline silicon layer 701 is exposed from the first through hole 704 and the second through hole 708 by a patterning process. A source electrode 707 is formed in the first through hole 704 and a drain electrode 705 is formed in the second through hole 708. The source electrode 707 and the drain electrode 705 are correspondingly in contact with the polycrystalline silicon layer 701 via the first through hole 704 and the second through hole 708.

According to embodiments of the present disclosure, when a structure of semiconductor device is not changed, the manufacturing method is optimized. The gate insulating and interlayer insulating layer is formed by one-time chemical vapor deposition process to replace two times of chemical vapor deposition process, thereby decreasing a thickness of the LTPS array substrate, reducing manufacturing steps, saving process time, and thus reducing the production cost.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A manufacturing method of a low temperature polysilicon (LTPS) array substrate, wherein the LTPS array substrate comprises a metal light-shielding layer, a buffer layer, a polycrystalline silicon layer, a gate insulating and interlayer insulating layer, a gate line layer, and a source and drain electrode layer, the manufacturing method comprising:
   step S10, providing a transparent substrate, depositing a metal layer on the transparent substrate, and patterning the metal layer for forming the metal light-shielding layer;
   step S20, forming the buffer layer on the metal light-shielding layer;
   step S30, forming the polycrystalline silicon layer on the buffer layer;
   step S40, forming the gate insulating and interlayer insulating layer through chemical vapor deposition on the polycrystalline silicon layer;
   step S50, forming the gate line layer on the gate insulating and interlayer insulating layer; and
   step S60, forming the source and drain electrode layer on the gate insulating and interlayer insulating layer;
   wherein the step S50 further comprises;
   step S501, coating negative photoresist on the gate insulating and interlayer insulating layer for exposure, for forming a patterned photoresist layer;
   step S502, performing a dry etching process on the gate insulating and interlayer insulating layer after developing the patterned photoresist layer; for forming a gate line trench;
   step S503, forming the gate line layer through physical vapor deposition in the gate line trench; and
   step S504, coating positive photoresist on the gate line layer, and performing an exposure and etching process for forming a gate line pattern;
   wherein the gate insulating and interlayer insulating layer are defined as a two-layer structures;
   wherein in the step S40, the chemical vapor deposition is a single chemical vapor deposition process applied to the buffer layer and the polycrystalline silicon layer to form a first gate insulating and interlayer insulating layer and form a second gate insulating and interlayer insulating layer directly on the first gate insulating and interlayer insulating layer such that the first gate insulating and interlayer insulating layer and the second gate insulating and interlayer insulating layer constitute the two-layer structure of the gate insulating and interlayer insulating layer formed by the single chemical vapor deposition process.

2. The manufacturing method according to claim 1, wherein a cross section shape of the gate line trench is rectangular.

3. The manufacturing method according to claim 1, wherein the step S60 further comprises:
   step S601, exposing, developing, and etching an upper portion of the gate insulating and interlayer insulating layer for forming through holes and a follow-up pattern;
   step S602, forming a source electrode and a drain electrode in the through holes, the source electrode and the drain electrode are correspondingly in contact with the polycrystalline silicon layer via the through holes, and forming the source and drain electrode layer.

4. The manufacturing method according to claim 3, wherein a cross section area of the through holes is in an inverted trapezoid shape.

5. The manufacturing method according to claim 1, wherein a material of the gate line layer is selected from a group consisting of molybdenum, titanium, aluminum, copper, and combinations of the molybdenum, the titanium, the aluminum, and the copper.

6. The manufacturing method according to claim 1, wherein a material of the buffer layer comprises silicon nitride, silicon oxide, or a combination of the silicon nitride and the silicon oxide, and a material of the gate insulating and interlayer insulating layer used in a manufacturing process of the LTPS array substrate comprises silicon nitride, silicon oxide, or a combination of the silicon oxide and the silicon oxide.

7. The manufacturing method according to claim 1, wherein a material of the metal light-shielding layer comprises molybdenum aluminum alloy, chromium, molybdenum, or materials with a light shielding function and electric conductivity simultaneously.

* * * * *